US006208581B1

United States Patent
You

(10) Patent No.: US 6,208,581 B1
(45) Date of Patent: Mar. 27, 2001

(54) HYBRID MEMORY DEVICE AND METHOD FOR CONTROLLING SAME

(75) Inventor: Min-Young You, Cheongju (KR)

(73) Assignee: Nyundai Electrons Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/562,943

(22) Filed: May 2, 2000

(30) Foreign Application Priority Data

May 11, 1999 (KR) .................................. 99-16768

(51) Int. Cl.[7] .................................................. G11C 8/00
(52) U.S. Cl. ........................ 365/230.06; 365/230.01; 365/230.08
(58) Field of Search ........................ 365/230.06, 230.01, 365/189.08, 230.08

(56) References Cited

U.S. PATENT DOCUMENTS

| 4,972,457 | * | 11/1990 | O'Sullivan | 379/59 |
| 5,757,690 | * | 5/1998 | McMahon | 365/104 |
| 6,128,218 | * | 10/2000 | You et al. | 365/156 |
| 6,134,174 | * | 10/2000 | Takase | 365/230.06 |

* cited by examiner

Primary Examiner—Richard Elms
Assistant Examiner—Hien Nguyen
(74) Attorney, Agent, or Firm—Morgan, Lewis & Bockius LLP

(57) ABSTRACT

A hybrid memory device uses an array of hybrid memory cells with each hybrid memory cell having a static RAM cell and a plurality of ROM cells. The hybrid memory device includes a read/write control unit for controlling a reading/writing operation of a selected hybrid memory cell in accordance with a write control signal and a read control signal; a decoder for decoding an address temporarily stored in a buffer in accordance with a first enable signal and a second enable signal, the address including a column address and a row address; a column line selecting unit for selecting a column line of the hybrid memory cell array in accordance with the column address decoded by the decoder; a wordline driving unit for driving a wordline of the hybrid memory cell array in accordance with the row address decoded by the decoder; a static RAM data input/output unit for storing external data in the static RAM cell of the selected hybrid memory cell or externally outputting data stored in the static RAM cell of the selected hybrid memory cell; and a ROM data output unit for externally outputting data stored in a selected ROM cell among the plurality of ROM cells of the selected hybrid memory cell.

20 Claims, 6 Drawing Sheets

FIG.5A DATA
FIG.5B /CSSRAM
FIG.5C SRAM-LWL
FIG.5D BIT 0, BIT 1
FIG.5E DCS 0
FIG.5F DCS 1
FIG.5G DL 0, DL 1
FIG.5H SRAM-DOUT
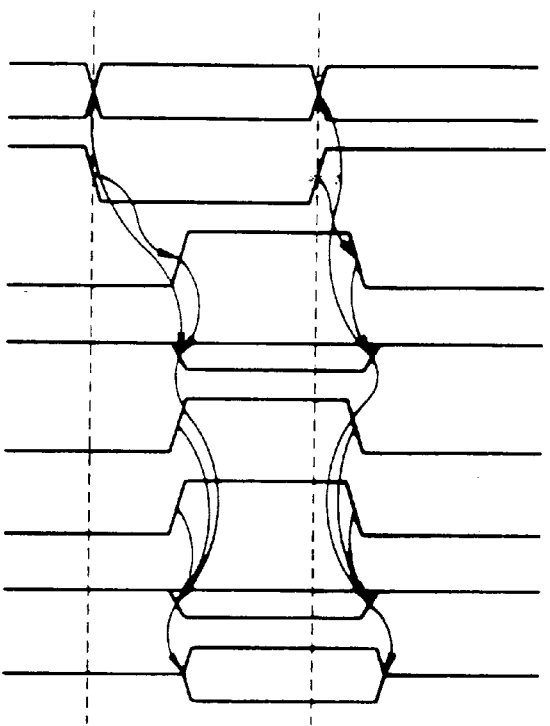
FIG.6A DIN, /DIN
FIG.6B /CSSRAM
FIG.6C DL 0, DL 1
FIG.6D DCS 0
FIG.6E DCS 1
FIG.6F BIT 0, BIT 1
FIG.6G SRAM-LWL
FIG.6H DATA (SRAM)
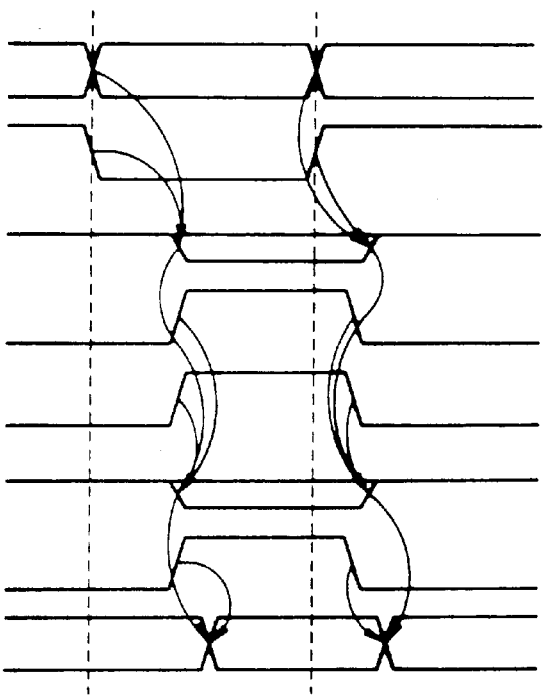

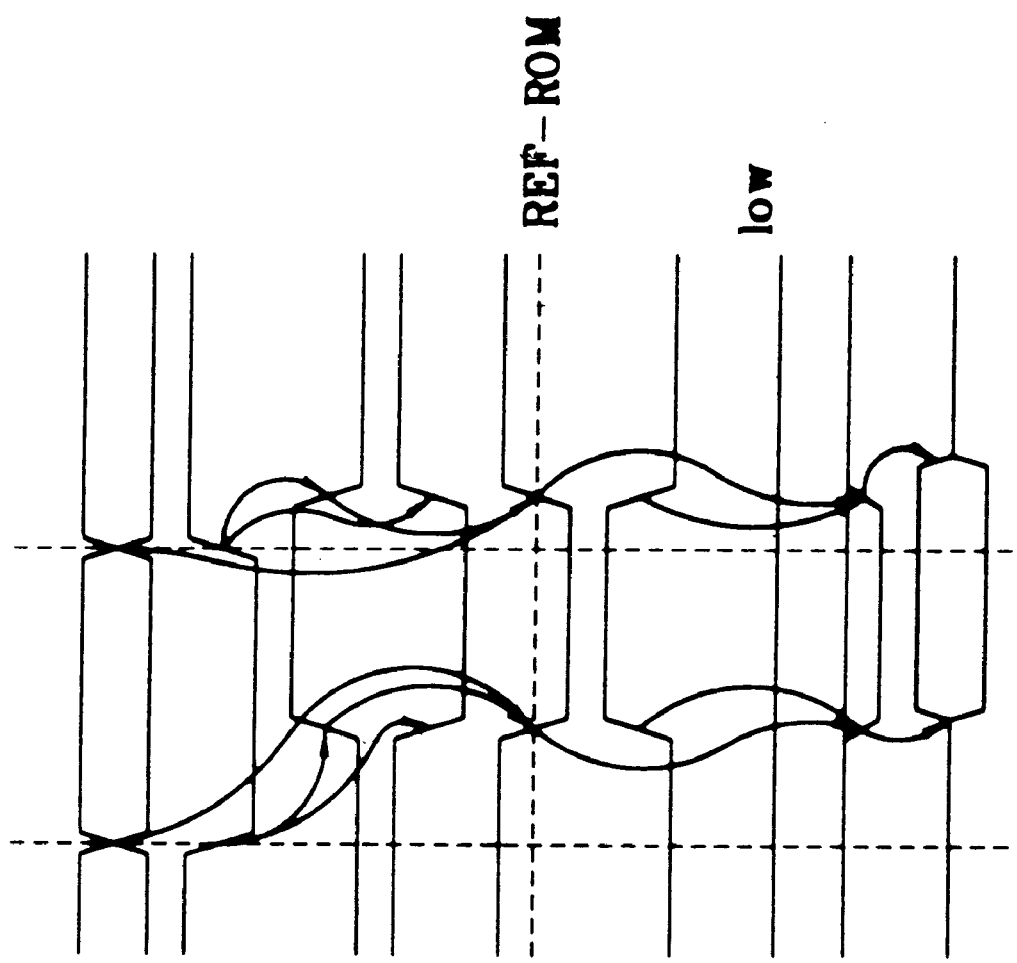

HYBRID MEMORY DEVICE AND METHOD FOR CONTROLLING SAME

This application claims the benefit of Korean Patent Application No. 16768/1999, filed in Korea on May 11, 1999, which is hereby incorporated by reference.

BACKGROUND OF THE INVENTION

1. Field of the Invention

The present invention relates to a memory device, and more particularly, to a hybrid memory device using a static RAM cell and a plurality of ROM cells.

2. Description of the Related Art

FIG. 1 is a block diagram of a conventional hybrid memory device for driving a memory cell array 1 having a static RAM cell 11 and a ROM cell 12. As shown in FIG. 1, a conventional hybrid memory device for driving the memory cell array 1 includes a static RAM control unit 2 for selecting the static RAM cell 11 in accordance with a write control signal /WE and a read control signal /RE; a static RAM decoder 3 for decoding an address ADD temporarily stored in a static RAM buffer 4 using a static RAM enable signal /CSSRAM; a static RAM data input/output unit 5 for storing data in the static RAM cell 11 in accordance with the static RAM enable signal /CSSRAM or for outputting the data stored in the static RAM cell 11; a ROM control unit 6 selecting the ROM cell 12 in accordance with the read control signal /RE; a ROM decoder 7 for decoding an address ADD temporarily stored in a ROM buffer 8 in accordance with a ROM enable signal /CSROM; and a ROM data output unit 9 for outputting data stored in the ROM cell 12. The operation of the conventional hybrid memory device will now be described with reference to FIGS. 2A–2G.

As shown in FIGS. 2A–2G, in the first interval (I) when the ROM enable signal /CSROM (FIG. 2C) is a high level and the static RAM enable signal /CSSRAM (FIG. 2B) is a low level, the address ADD temporarily stored in the static RAM buffer 4 is decoded by the static RAM decoder 3. Using the decoded signal, the desired static RAM cell 11 of the memory cell array 1 is selected and enabled. Here, when the write control signal /WE (FIG. 2D) is a high level and the write control signal /RE (FIG. 2E) is a low level, the data stored in the selected static RAM cell 11 are externally outputted by the static RAM data input/output unit 5. In contrast, when the write control signal /WE (FIG. 2D) and the read control signal /RE (FIG. 2E) are respectively low and high levels, the external data DIN, /DIN are stored in the static RAM cell 11 selected by the static RAM data input/output unit 5.

In the second interval (II), both the static RAM enable signal /CSSRAM (FIG. 2B) and the ROM enable signal /CSROM (FIG. 2C) are high levels, and the hybrid device is in a stand-by mode. That is, an external dis-able state is set.

In the third interval (III), when the static RAM enable signal /CSSRAM (FIG. 2B) is a high level and the ROM enable signal /CSROM (FIG. 2C) is a low level, the address ADD stored in the ROM buffer 8 is decoded by the ROM decoder 7. Thus, the desired ROM cell 12 of the hybrid memory cell array 1 is selected with respect to the decoded signal and enabled. Here, when the read control signal /RE is a low level, the data temporarily stored in the enabled ROM cell 12 are externally outputted by the ROM data output unit 9.

However, the conventional hybrid memory device using the static RAM cell 11 and the ROM cell 12 has a problem in that the static RAM cell 11 and the ROM cell 12 respectively employ peripheral circuits such as the buffers 4, 8 and the decoders 3, 7. As a result, the conventional hybrid memory device occupies an unnecessarily large layout area.

SUMMARY OF THE INVENTION

Accordingly, the present invention is directed to a hybrid memory device that substantially obviates one or more of the problems due to limitations and disadvantages of the related art.

An object of the present invention is to provide a hybrid memory device that improves the integration of a ROM cell wherein a static RAM cell and a ROM cell constitute a unit hybrid memory cell, thereby reducing a layout area because the static RAM cell and the ROM cell share a single peripheral circuit.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a hybrid memory device using an array of hybrid memory cells with each hybrid memory cell having a static RAM cell and a plurality of ROM cells comprises a read/write control unit for controlling a reading/writing operation of a selected hybrid memory cell in accordance with a write control signal and a read control signal; a decoder for decoding an address temporarily stored in a buffer in accordance with a first enable signal and a second enable signal, the address including a column address and a row address; a column line selecting unit for selecting a column line of the hybrid memory cell array in accordance with the column address decoded by the decoder; a wordline driving unit for driving a wordline of the hybrid memory cell array in accordance with the row address decoded by the decoder; a static RAM data input/output unit for storing external data in the static RAM cell of the selected hybrid memory cell or externally outputting data stored in the static RAM cell of the selected hybrid memory cell; and a ROM data output unit for externally outputting data stored in a selected ROM cell among the plurality of ROM cells of the selected hybrid memory cell.

In another aspect, a method for controlling a hybrid memory device using an array of hybrid memory cells with each hybrid memory cell having a static RAM cell and a plurality of ROM cells comprises the steps of controlling a reading/writing operation of a selected hybrid memory cell in accordance with a write control signal and a read control signal; decoding an address temporarily stored in a buffer in accordance with a first enable signal and a second enable signal, the address including a column address and a row address; selecting a column line of the hybrid memory cell array in accordance with the decoded column address; driving a wordline of the hybrid memory cell array in accordance with the decoded row address; storing external data received via a static RAM data input/output unit in the static RAM cell of the selected hybrid memory cell; externally outputting data stored in the static RAM cell of the selected hybrid memory cell via a static RAM data input/output unit; and externally outputting data stored in a selected ROM cell among the plurality of ROM cells of the selected hybrid memory cell via a ROM data output unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 5A–5H are timing diagrams for the device of FIG. 3 illustrating when data stored in a static RAM cell are externally outputted;

FIGS. 6A–6H are timing diagrams for the device of FIG. 3 illustrating when external data are stored in a static RAM cell; and FIGS. 7A–7I are timing diagrams for the device of FIG. 3 illustrating when data stored in a ROM cell are externally outputted.

DETAILED DESCRIPTION OF THE INVENTION

Reference will now be made in detail to the preferred embodiments of the present invention, examples of which are illustrated in the accompanying drawings.

The present invention provides a hybrid memory device that improves the integration of a ROM cell with a RAM cell. The data of the static RAM cell and the ROM cell is transmitted by dividing a bit line and a bit bar line of the static RAM into a first bit line and a second bit line to be suitable for characteristics of the static RAM cell and the ROM cell.

Figure 1:
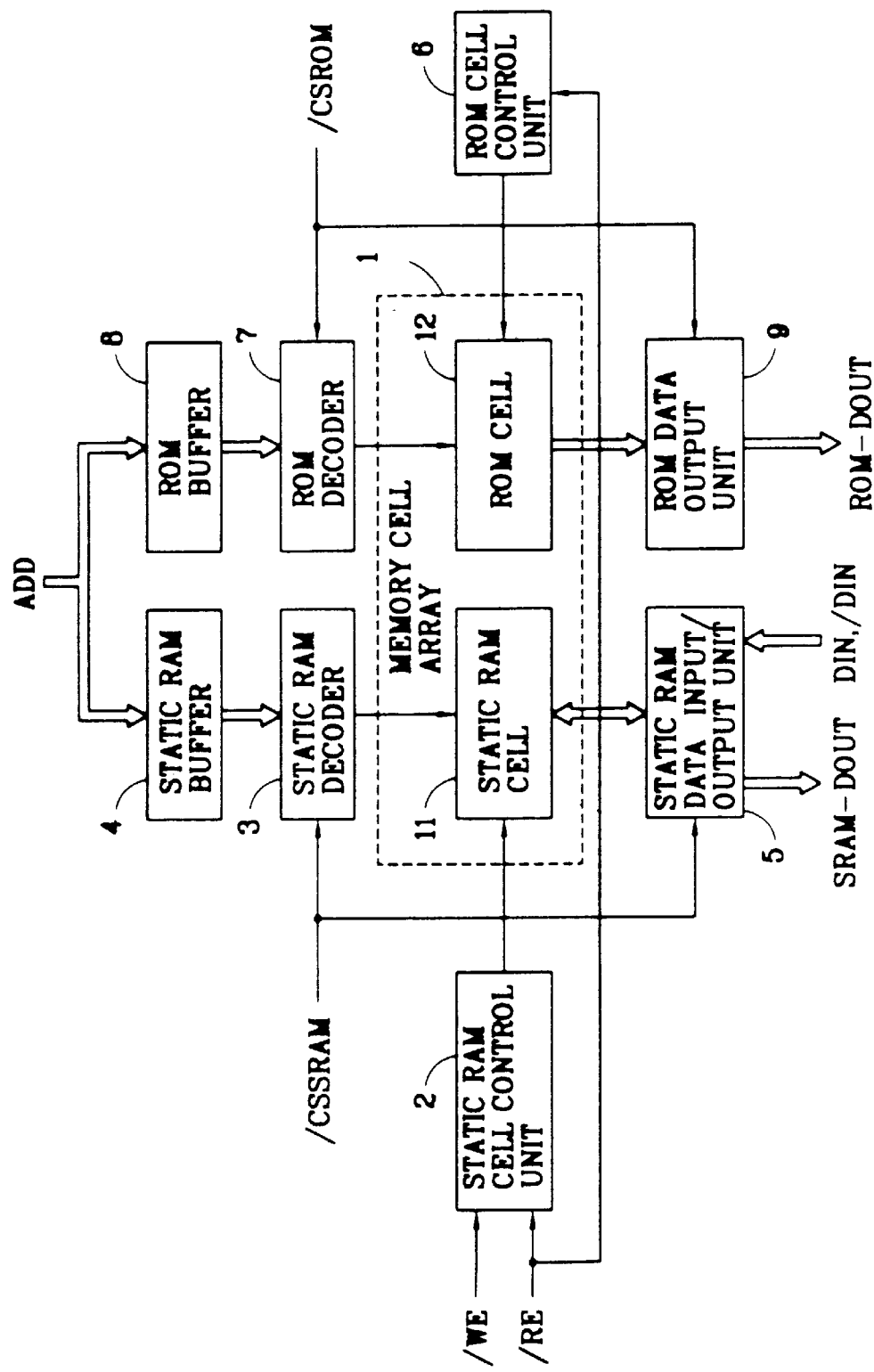
FIG. 1 is a block diagram illustrating a conventional hybrid memory device.
Figure 2:
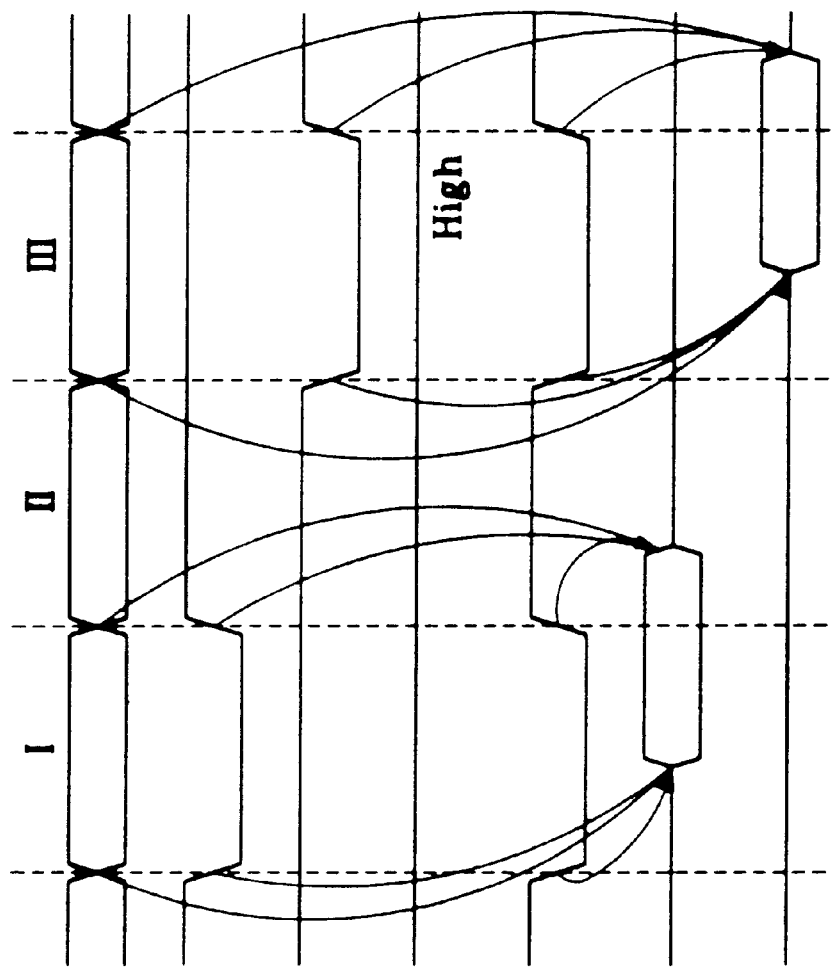
FIGS. 2A–2G are timing diagrams for the device of FIG. 1.
Figure 3:
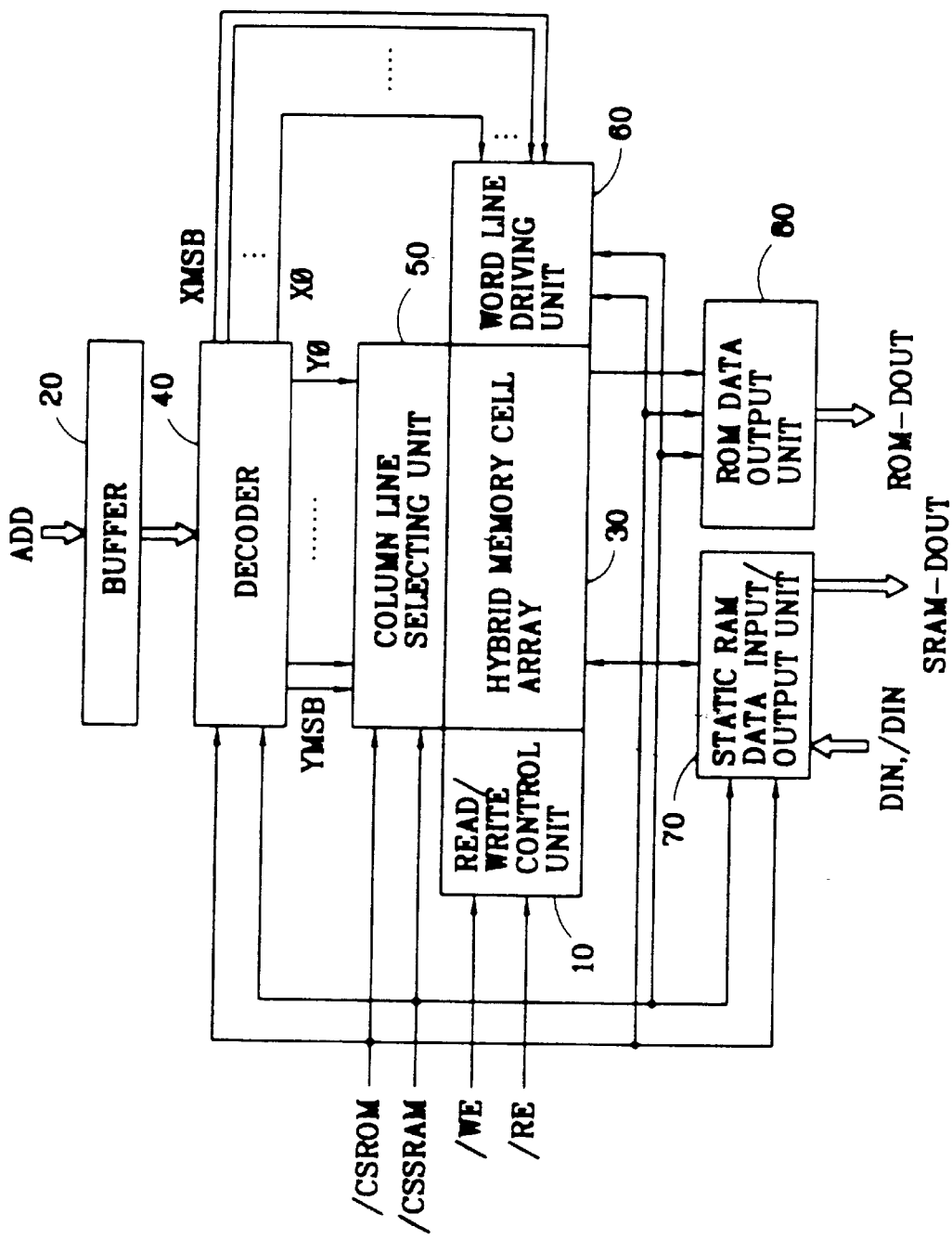
FIG. 3 is a block diagram illustrating a hybrid memory device according to an embodiment of the present invention.
Figure 4:
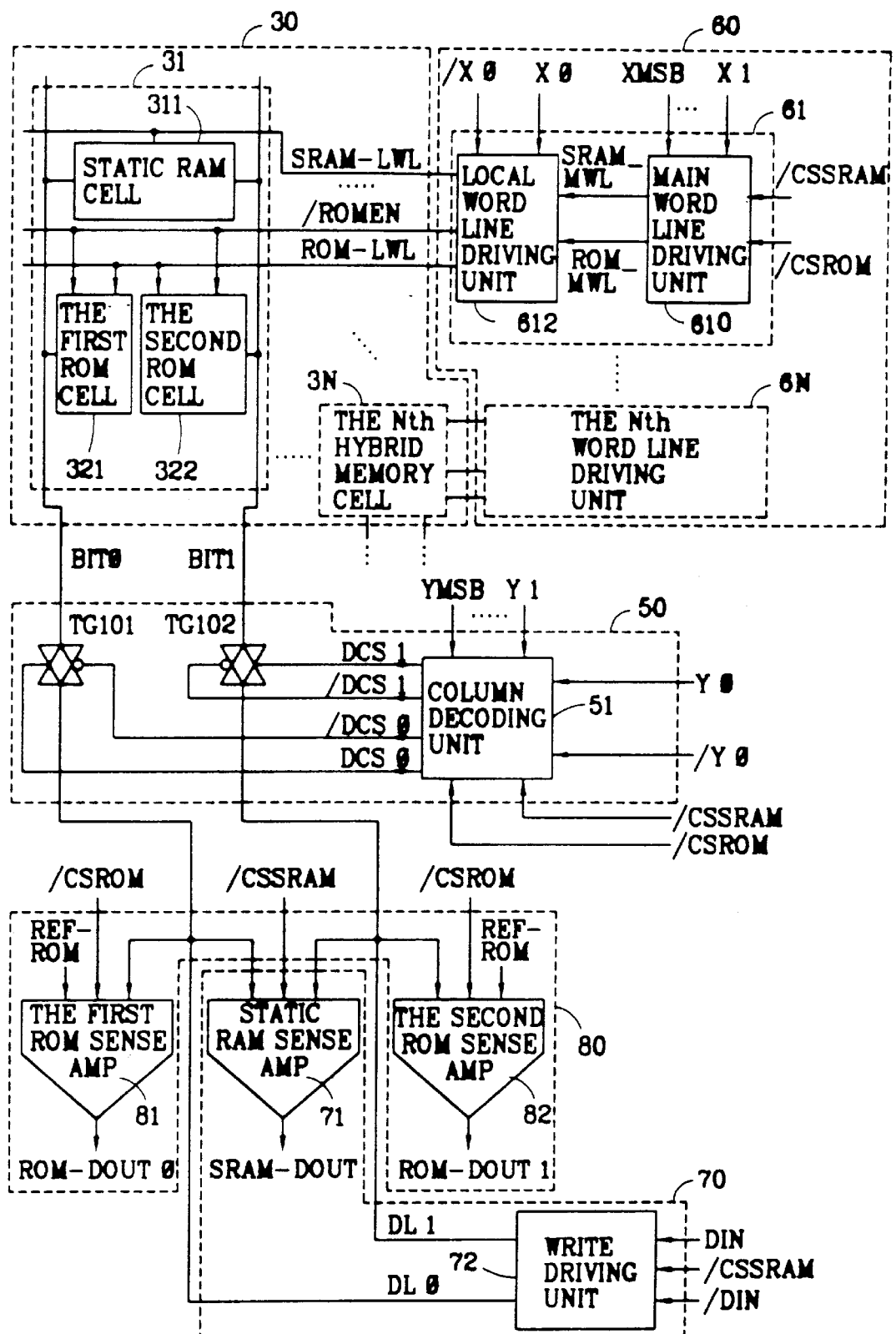
FIG. 4 is a detailed circuit diagram corresponding to the block diagram of in FIG. 3.

FIG. 3 is a block diagram illustrating a hybrid memory device according to an embodiment of the present invention. FIG. 4 is a detailed circuit diagram illustrating main parts of the hybrid memory device of FIG. 3.

Referring to FIGS. 3 and 4, the hybrid memory device according to the present invention drives a hybrid memory cell array 30 having a plurality of unit hybrid memory cells 31, each using a static RAM cell 311 as well as first and second ROM cells 321, 322. Here, in the embodiment of the present invention two ROM cells are employed, but the number of the ROM cells can be other multiples of two. The hybrid memory device includes a read/write control unit 10 for controlling a reading/writing operation of the hybrid memory cell 31 in accordance with a write control signal /WE and a read control signal /RE; a decoder 40 for decoding an address ADD temporarily stored in a buffer 20 in accordance with a static RAM enable signal /CSSRAM and a ROM enable signal /CSROM; a column line selecting unit 50 for selecting a column line of the hybrid memory cell array 30 in accordance with a column address YMSB~Y0 decoded by the decoder 40; a wordline driving unit 60 for driving a wordline of the hybrid memory cell array 30 in accordance with a row address XMSB~X0 decoded by the decoder 40; a static RAM data input/output unit 70 for storing external data DIN, /DIN in the static RAM cell 311 of the selected hybrid memory cell 31 or externally outputting data stored in the static RAM cell 311 thereof; and a ROM data output unit 80 for externally outputting data stored in the first ROM cell 321 or the second ROM cell 322 of the selected hybrid memory cell 31.

As shown in FIG. 4, the hybrid memory cell array 30 consists of first to Nth hybrid memory cells 31~3N, each consisting of a static RAM cell 311 and first and second ROM cells 321, 322. The column line selecting unit 50 selects a column line of the hybrid memory array 30 by coding the column address YMSB~Y0 in accordance with the static RAM enable signal /CSSRAM and the ROM enable signal /CSROM. Similarly, the wordline driving unit 60 drives wordlines of the hybrid memory array 30 by coding a row address XMSB~X0 in accordance with the static RAM enable signal /CSSRAM and the ROM enable signal /CSROM. At the same time, the static RAM data input/output unit 70 (controlled by the static RAM enable signal /CSSRAM) stores the external data DIN, /DIN in the static RAM cell 311 or externally outputs the data stored in the static RAM cell 311. Similarly, the ROM data output unit 80 (controlled by the ROM enable signal /CSROM) outputs data stored in the first ROM cell 321 or the second ROM cell 322.

The column line selecting unit 50 includes first transmitting gate TG101, second transmitting gate TG102, and a column decoding unit 51. The first and second transmitting gate TG101, TG102 selectively output data loaded in first and second bit lines BIT0, BIT1 to the static RAM data input/output unit 70 or to the ROM data output unit 80. The column decoding unit 51 is controlled by the static RAM enable signal /CSSRAM, the ROM enable signal /CSROM, coding lowest bits /Y0 of the column address YMSB~Y0, and an inverted address thereof. The column decoding unit 51 thus outputs a first control signal DCS0, an inverted signal /DCS0 thereof, a second control signal DCS1, and an inverted signal /DCS1 thereof, thereby controlling the first and second transmitting gates TG101, TG102.

The wordline driving unit 60 comprises first to Nth wordline driving units 61~6N. As shown, the first wordline driving unit 61 includes a main wordline driving unit 610 and a local wordline driving unit 612. The main wordline driving unit 610 is controlled by the static RAM enable signal /CSSRAM and the ROM enable signal /CSROM to output a static RAM main wordline signal SRAM-MWL, and a ROM main wordline signal ROM-MWL by coding row addresses XMSB~X1 except for the lowest bit X0 of the row address. The local wordline driving unit 612 outputs a static RAM local wordline signal SRAM-LWL, a ROM local wordline signal ROM-LWL, and a ROM cell enable signal /ROMEN according to the static RAM main wordline signal SRAM-MWL, the ROM main wordline signal ROM-MWL, the lowest bit X0 of the row address, and an inverted bit /X0 thereof.

The static RAM data input/output unit 70 includes a static RAM sense amp 71 and a write driving unit 72. The static RAM sense amp 71 is controlled by the static RAM enable signal /CSSRAM and amplifies the data loaded in the first and second bit lines BIT0, BIT1. The write driving unit 72 is controlled by the static RAM enable signal /CSSRAM and stores the external data DIN, /DIN received from the selected static RAM cell 311 via the first and second data lines DL0, DL1.

The ROM data output unit 80 includes first and second ROM sense amps 81, 82. The first sense amp 81 is controlled by the ROM enable signal /CSROM and amplifies the data loaded in the first bit line BIT0 according to a referential ROM cell REF-ROM. The second ROM sense amp 82 is controlled by the ROM enable signal /CSROM and amplifies the data loaded in the second bit line BIT1 according to the referential ROM cell REF-ROM.

Now, the operation of the hybrid memory device according to the present invention will be described in detail with reference to FIG. 4, FIGS. 5A–5H, FIGS. 6A–6H, and FIGS. 7A–7I. Specifically, a case when the static RAM cell 311 and the first ROM cell 321 of the first hybrid memory cell 31 of the embodiment of FIG. 4 are selected.

First, a first wordline driving unit 61 (controlled by the static RAM enable signal /CSSRAM and the ROM enable signal /CSROM) drives main wordlines and local wordlines to select the static RAM cell 311 and the first and second ROM cells 321, 322 by coding lowest bits /X0 of the row address XMSB~X0 and an inverted address thereof and outputs the ROM cell enable signal /ROMEN to select the first and second ROM cells 321, 322.

As shown in FIGS. 5A–5H, when externally outputting data stored in the static RAM cell 311, the first main wordline SRAM-MWL is driven by the first main wordline driving unit 610 of the first wordline driving unit 61, and the first local wordline SRAM-LWL is driven by the first local wordline driving unit 612 thereof. Thus, the data stored in the selected static RAM cell 311 are loaded in the first and second bit lines BIT0, BIT1. Here, if one of the first and second bit lines BIT0, BIT1 is a bit line BIT, the other thereof is a bit bar line /BIT. Next, the first and second transmitting gates TG101, TG102 are respectively turned on by the first control signal DCS0 and the inverted signal thereof /DCS0, and by the second control signal DCS1 and the inverted signal /DCS1 thereof in which the lowest bits /Y0 of the column address YMSB~Y0 and the inverted address thereof are coded by the column line selecting unit 50. Thus, the data of the first and second bit lines BIT0, BIT1 are transmitted to the static RAM sense amp 71. Here, it is noted that the first and second control signals DCS0, DCS1 are substantially identical signals. The static RAM sense amp 71 (controlled by the static RAM enable signal /CSSRAM) amplifies the data transmitted by the first and second transmitting gates TG101, TG102, thereby supplying output data SRAM-DOUT.

As shown in FIGS. 6A–6H, when storing the external data DIN, /DIN in the selected static RAM cell 311, the external data DIN, /DIN are loaded in the first and second data lines DL0, DL1 by the write driving unit 72, which is controlled by the static RAM enable signal /CSSRAM. The first and second transmitting gates TG101, TG102 are respectively turned on in accordance with the first control signal DCS0 and the inverted signal thereof /DCS0, and the second control signal DCS1 and the inverted signal thereof /DCS1. Thus, the data loaded in the first and second data lines DL0, DL1 are stored in the selected static RAM cell 311 through the first and second bit lines BIT0, BIT1 in accordance with the static RAM main wordline signal SRAM-MWL and the local wordline signal SRAM-LWL. Here, the first and second control signals DCS0, DCS1 are substantially identical signals. Also, if one of the first and second bit lines BIT0, BIT1 is the bit line BIT, the other thereof is the bit bar line /BIT.

As shown in FIGS. 7A–7I, when externally outputting the data stored in the first ROM cell 321, the ROM main wordline is driven by the first main wordline driving unit 610 of the first wordline driving unit 61, and the ROM local wordline is driven by the first local wordline driving unit 612. Here, the first ROM cell 321 of the first and second ROM cells 321, 322 is selected in accordance with the ROM cell enable signal /ROMEN. Thus, the data stored in the selected first ROM cell 321 are loaded in the first bit line BIT0. The first transmitting gate TG101 is turned on by the first control signal DCS0, /DCS0 for which the lowest bits /Y0 of the column address YMSB~Y0 and the inverted address thereof are coded in the column line selection unit 50. Accordingly, the data loaded in the first bit line BIT0 are transmitted to the first ROM sense amp 81, which is controlled by the ROM enable signal /CSROM. Furthermore, the data transmitted by the first transmitting gate TGIO1 is amplified according to the referential ROM cell REF-ROM, thereby outputting the output data ROM-DOUT. Here, the decoder 40 decodes the address ADD temporarily stored in the buffer 20 and outputs the column address YMSB~Y0 and the row address XMSB~X0. Also, the buffer 20 and the decoder 40 are commonly used when selecting the static RAM cell 311 or selecting the first and second ROM cells 321, 322. Thus, the wordline driving unit 60 and the column line selecting unit 50 select the static RAM cell 311, the first ROM cell 321, or the second ROM cell 322 in accordance with the column address YMSB~Y0 and the row address XMSB~X0 decoded by the decoder 40.

As described above, when the ROM enable signal is enabled in the hybrid memory cell array in which the static RAM cell and the ROM cell form a unit hybrid memory cell, the hybrid memory device of the present invention separates the bit line and the bit bar line used in the static RAM into the first and second bit lines, respectively, to use as the data lines of the first ROM cell and the second ROM cell, so that the rate of the static RAM cell and the ROM can be doubled, quadrupled, etc. As a result, the integration of the ROM is improved. Also, with the hybrid memory device of the present invention, the sense amp may be divided into the static RAM sense amp and the ROM sense amp to be suitable for the respective characteristics of the static RAM cell and the ROM cell. Thus, the amplifying efficiency is increased. Additionally, in the hybrid memory device of the present invention, the main wordline driving unit outputs the main wordline signal for the coded row address to be controlled by the static RAM enable signal and outputs the ROM enable signal. Accordingly, the layout area of the local wordline driving unit is reduced.

It will be apparent to those skilled in the art that various modifications and variations can be made in the hybrid memory device of the present invention without departing from the spirit or scope of the invention. Thus, it is intended that the present invention cover the modifications and variations of this invention provided they come within the scope of the appended claims and their equivalents.

What is claimed is:

1. A hybrid memory device using an array of hybrid memory cells, each hybrid memory cell having a static RAM cell and a plurality of ROM cells, the hybrid memory device comprising:

a read/write control unit for controlling a reading/writing operation of a selected hybrid memory cell in accordance with a write control signal and a read control signal;

a decoder for decoding an address temporarily stored in a buffer in accordance with a first enable signal and a second enable signal, the address including a column address and a row address;

a column line selecting unit for selecting a column line of the hybrid memory cell array in accordance with the column address decoded by the decoder;

a wordline driving unit for driving a wordline of the hybrid memory cell array in accordance with the row address decoded by the decoder;

a static RAM data input/output unit for storing external data in the static RAM cell of the selected hybrid memory cell or externally outputting data stored in the static RAM cell of the selected hybrid memory cell; and a ROM data output unit for externally outputting data stored in a selected ROM cell among the plurality of ROM cells of the selected hybrid memory cell.

2. The hybrid memory device according to claim 1, wherein the first enable signal controls the static RAM and the second enable signal controls the ROM.

3. The hybrid memory device according to claim 1, wherein the column line selecting unit includes:

first and second transmitting gates for selectively outputting data loaded in first and second bit lines to the static RAM data input/output unit or to the ROM data output unit; and a column decoding unit controlled by the first enable signal and the second enable signal for coding lowest bits of the column address and an inverted address thereof and for outputting a first control signal and a second control signal to control the first and second transmitting gates, respectively.

4. The hybrid memory device according to claim 3, wherein when the static RAM cell is selected, if one of the first and second bit lines is a bit line, the other one of the first and second bit lines is a bit bar line.

5. The hybrid memory device according to claim 3, wherein the first and second bit lines are respectively operated as separate data lines when the ROM cell is selected.

6. The hybrid memory device according to claim 3, wherein the first and second control signals are the same when the static RAM cell is selected, and the first and second control signal are alternately operated when the ROM cell is selected.

7. The hybrid memory device according to claim 3, wherein the wordline driving unit includes:

a main wordline driving unit controlled by the first enable signal and the second enable signal for outputting a static RAM main wordline signal and a ROM main wordline signal by coding row addresses except for the lowest bit of the row address; and a local wordline driving unit for outputting a static RAM local wordline signal, a ROM local wordline signal and a ROM cell enable signal by combining the static RAM main wordline signal, the ROM main wordline signal, the lowest bit of the row address, and an inverted bit of the lowest bit of the row address.

8. The hybrid memory device according to claim 1, wherein the wordline driving unit includes:

a main wordline driving unit controlled by the first enable signal and the second enable signal for outputting a static RAM main wordline signal and a ROM main wordline signal by coding row addresses except for the lowest bit of the row address; and a local wordline driving unit for outputting a static RAM local wordline signal, a ROM local wordline signal and a ROM cell enable signal by combining the static RAM main wordline signal, the ROM main wordline signal, the lowest bit of the row address, and an inverted bit of the lowest bit of the row address.

9. The hybrid memory device according to claim 8, wherein the ROM cell enable signal is a control signal to enable one of the plurality of ROM cells of the hybrid memory cell.

10. The hybrid memory device according to claim 3, wherein the static RAM data input/output unit includes:

a static RAM sense amp controlled by the first enable signal for amplifying the data loaded in the first and second bit lines; and a write driving unit controlled by the first enable signal for outputting external data to the first and second bit lines through first and second data lines.

11. The hybrid memory device according to claim 3, wherein the ROM data output unit includes:

a first ROM sense amp controlled by the second enable signal for amplifying the data loaded in the first bit line using a referential ROM cell signal; and a second ROM sense amp controlled by the second enable signal for amplifying the data loaded in the second bit line using the referential ROM cell signal.

12. A method for controlling a hybrid memory device using an array of hybrid memory cells, each hybrid memory cell having a static RAM cell and a plurality of ROM cells, the method comprising the steps of:

controlling a reading/writing operation of a selected hybrid memory cell in accordance with a write control signal and a read control signal;

decoding an address temporarily stored in a buffer in accordance with a first enable signal and a second enable signal, the address including a column address and a row address;

selecting a column line of the hybrid memory cell array in accordance with the decoded column address;

driving a wordline of the hybrid memory cell array in accordance with the decoded row address;

storing external data received via a static RAM data input/output unit in the static RAM cell of the selected hybrid memory cell;

externally outputting data stored in the static RAM cell of the selected hybrid memory cell via a static RAM data input/output unit; and externally outputting data stored in a selected ROM cell among the plurality of ROM cells of the selected hybrid memory cell via a ROM data output unit.

13. The method according to claim 12, wherein the first enable signal controls the static RAM and the second enable signal controls the ROM.

14. The method according to claim 12, wherein the selecting step includes the steps of:

selectively outputting data loaded in first and second bit lines to the static RAM data input/output unit or to the ROM data output unit via first and second transmitting gates; and coding lowest bits of the column address and an inverted address thereof according to the first and second enable signals;

outputting a first control signal and a second control signal to control the first and second transmitting gates, respectively, according to the first and second enable signals.

15. The method according to claim 14, wherein when the static RAM cell is selected, if one of the first and second bit lines is a bit line, the other one of the first and second bit lines is a bit bar line.

16. The method according to claim 14, wherein the first and second bit lines are respectively operated as separate data lines when the ROM cell is selected.

17. The method according to claim 14, wherein the first and second control signals are the same when the static RAM cell is selected, and the first and second control signal are alternately operated when the ROM cell is selected.

18. The method according to claim 14, wherein the driving step includes the steps of:

driving a main wordline according to the first enable signal and the second enable signal to output a static RAM main wordline signal and a ROM main wordline signal by coding row addresses except for the lowest bit of the row address; and driving a local wordline to output a static RAM local wordline signal, a ROM local wordline signal, and a ROM cell enable signal by combining the static RAM main wordline signal, the ROM main wordline signal, the lowest bit of the row address, and an inverted bit of the lowest bit of the row address.

19. The method according to claim 12, wherein the driving step includes the steps of:

driving a main wordline according to the first enable signal and the second enable signal to output a static RAM main wordline signal and a ROM main wordline signal by coding row addresses except for the lowest bit of the row address; and driving a local wordline to output a static RAM local wordline signal, a ROM local wordline signal, and a ROM cell enable signal by combining the static RAM main wordline signal, the ROM main wordline signal, the lowest bit of the row address, and an inverted bit of the lowest bit of the row address.

20. The method according to claim 19, wherein the ROM cell enable signal is a control signal to enable one of the plurality of ROM cells of the hybrid memory cell.

* * * * *